United States Patent
Chakraborty

(10) Patent No.: US 9,667,193 B2
(45) Date of Patent: May 30, 2017

(54) LOW POWER WIDE TUNING RANGE OSCILLATOR

(71) Applicant: Texas Instruments Incorporated, Dallas, TX (US)

(72) Inventor: Sudipto Chakraborty, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 14/447,478

(22) Filed: Jul. 30, 2014

(65) Prior Publication Data

US 2016/0036382 A1    Feb. 4, 2016

(51) Int. Cl.
   | | |
   |---|---|
   | *H03K 3/16* | (2006.01) |
   | *H03B 5/12* | (2006.01) |
   | *H03B 5/08* | (2006.01) |
   | *H03B 1/00* | (2006.01) |

(52) U.S. Cl.
CPC ............ *H03B 5/1215* (2013.01); *H03B 1/00* (2013.01); *H03B 5/08* (2013.01); *H03B 5/125* (2013.01); *H03B 5/1212* (2013.01); *H03B 5/1228* (2013.01); *H03B 5/1262* (2013.01); *H03B 5/1296* (2013.01); *H03B 2200/0082* (2013.01); *H03B 2201/0266* (2013.01)

(58) Field of Classification Search
CPC ............ H03B 27/00; H03B 1/00; G01H 5/02
USPC ................... 331/2, 46, 48, 49, 167, 117 FE
See application file for complete search history.

(56) References Cited

U.S. PATENT DOCUMENTS

| | | | |
|---|---|---|---|
| 8,779,865 B2* | 7/2014 | Ainspan | H03L 7/099 331/117 FE |
| 2009/0174493 A1* | 7/2009 | Jeon | H01F 21/12 331/181 |
| 2010/0271144 A1* | 10/2010 | McCorquodale | H03B 5/04 331/117 FE |
| 2011/0084771 A1* | 4/2011 | Nagaraj | H03B 5/1228 331/117 FE |

* cited by examiner

*Primary Examiner* — Arnold Kinkead
(74) *Attorney, Agent, or Firm* — John R. Pessetto; Charles A. Brill; Frank D. Cimino

(57) ABSTRACT

A wide tuning range oscillator system uses multiple active cores with cross-coupled transistors and multiple tapped inductors having windings that can be connected to circuit nodes. These active cores are connected to a pair of symmetric tapping points and are switched ON/OFF by biasing elements. Biasing schemes and the topology of the individual cross-coupled cores may be different from each other. The tapping points are symmetrically arranged around the center point of the inductor. One or more of the active cores may be enabled for tuning the center frequency of the oscillator system.

15 Claims, 5 Drawing Sheets

LOW POWER WIDE TUNING RANGE OSCILLATOR

TECHNICAL FIELD

This disclosure is generally directed to oscillators. More specifically, this disclosure is directed to a low power wide tuning range oscillator.

BACKGROUND

It is often necessary or desirable for a voltage-controlled oscillator (VCO) to provide a wide tuning range. Various methods can be used to achieve a higher tuning range in a voltage-controlled oscillator. To adjust a center frequency of oscillator, some wide tuning range oscillators include multiple switchable capacitors and/or inductors that are switched in and out using complimentary metal oxide semiconductor (CMOS) switches. Unfortunately, switching capacitors or inductors to the resonating tank circuit reduces the quality (Q) factor of an oscillator.

SUMMARY

In a first example, an oscillator includes a first oscillator core having a first pair of cross-coupled transistors including first and second transistors and a first resistor coupled to the first pair of cross-coupled transistors. The oscillator also includes a resonator tank having a capacitor and a tapping inductor. The tapping inductor has a first symmetrical pair of tapping nodes including first and second tapping nodes. The first tapping node is coupled to the first transistor, the second tapping node is coupled to the second transistor, and the capacitor is coupled between the first and second tapping nodes.

In a second example, an oscillator includes a first oscillator core having a first pair of cross-coupled transistors including first and second transistors. The first transistor has a first source, a first gate, and a first drain, and the second transistor has a second source, a second gate, and a second drain. The first gate is coupled to the second drain, and the second gate is coupled to the first drain. The first oscillator core also includes a first resistor coupled to the first and second sources. The oscillator also includes a resonator tank having a capacitor and a tapping inductor. The tapping inductor has a first symmetrical pair of tapping nodes including first and second tapping nodes. The first tapping node is coupled to the first drain, the second tapping node is coupled to the second drain, and the capacitor is coupled between the first and second tapping nodes.

In a third example, a method includes turning a first oscillator core of an oscillator on and off and turning a second oscillator core of the oscillator on and off. A center frequency of the oscillator is based on which of the oscillator cores is turned on and which of the oscillator cores is turned off. The first oscillator core includes a first pair of cross-coupled transistors including first and second transistors and a first resistor coupled to the first pair of cross-coupled transistors. The oscillator further includes a resonator tank having a capacitor and a tapping inductor. The tapping inductor has a first symmetrical pair of tapping nodes including first and second tapping nodes. The first tapping node is coupled to the first transistor, the second tapping node is coupled to the second transistor, and the capacitor is coupled between the first and second tapping nodes.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1A:
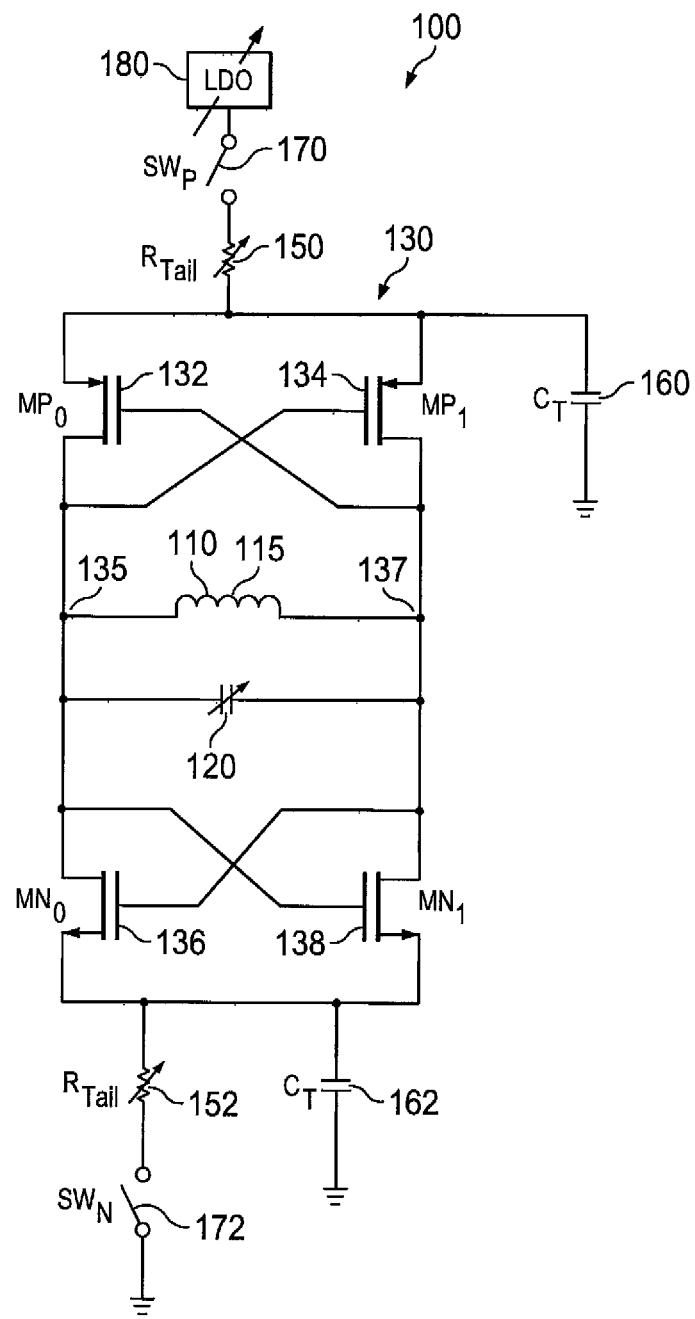
FIGS. 1A-1C illustrates examples of low power wide tuning range oscillators according to this disclosure.

FIGS. 1A through 3, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

The development of low power multi-band receivers integrated in a single integrated circuit chip is a topic of interest. Low power multi-band receivers require wide tuning range high fidelity oscillators that can be realized on a single chip. Various methods to achieve a higher tuning range include:

(a) using a fixed inductor and a high Q factor tunable capacitor array;

(b) using two magnetically-coupled inductors with a metal-oxide semiconductor (MOS) switch that is separate from a main resonator tank, and tuning an inductance of the overall tank circuit;

(c) using multiple on-chip oscillators; and (d) using a combination of (a), (b), and (c).

This disclosure describes an autotransformer-like oscillator configuration having multiple cross-coupled transistor-based active cores that are coupled to multiple tapped points of an inductor. Individual cross-coupled pairs of active cores can be enabled and disabled by turning their current sources ON and OFF, respectively. When a core is OFF, the core provides minimum loading onto a resonator tank. A tapping inductor may not consume any additional area of an integrated circuit (IC) chip compared to a coupled inductor and capacitor array. Using this autotransformer-like configuration, a wide tuning range voltage-controlled oscillator (VCO) using low power and having a low area of implementation can be realized.

An inductance and a capacitance may be associated with any oscillator core, and each inductor and each capacitor has an intrinsic quality factor. The quality factor (ratio of energy stored compared with energy dissipated) of a capacitor is diminished when a switch is connected in series with the capacitor, and the quality factor of the switched capacitor is defined at least partially by the series-connected switch. The quality factor of an inductor is diminished when a resistor is connected in series with the inductor, and the quality factor (such as associated loss) of the inductor is defined at least partially by the series-connected resistor. The quality factor of the inductor is also diminished by a switch in a closed loop around the inductor in the case of a tuned inductor. Lower quality factor leads to increased power consumption and worse jitter performances from the oscillator.

In the oscillators of this disclosure, no switch is connected in series with a capacitor, and no resistor is connected in series with an inductor. As a result, the intrinsic quality factors of the capacitor and inductor are not diminished. The center frequency (also referred to as the resonant frequency) of an LC circuit can be expressed as $$\frac{1}{2\pi\sqrt{LC}}$$

Hertz or $$\frac{1}{\sqrt{LC}}$$

Radians. In order to change the center frequency, a change to the amount of inductance or capacitance may be used. In this disclosure, switching is applied without affecting the quality factor of the inductance or capacitance since there is no direct connection of a switch to the resonator tank. Instead, an oscillator core is turned ON and OFF by programming the biasing resistors of the oscillator cores using a switch that is not part of the resonator tank and hence does not affect the quality factor of the resonator tank.

FIG. 1A illustrates an example low power wide tuning range (LPWTR) oscillator 100 according to this disclosure. Although certain details will be provided with reference to the components of the oscillator 100, it should be understood that other embodiments may include more, less, or different components.

The oscillator 100 performs a self-sustainable frequency waveform generation. As shown in FIG. 1, the oscillator 100 includes a tapping inductor 110, a capacitor 120, one or more oscillator cores 130, biasing resistors 150, 152 and tail capacitors 160, 162 respectively associated with different inputs.

The tapping inductor 110 acts as an autotransformer coupled to the core 130 and to another oscillator core similar to the oscillator 100. The tapping inductor 110 includes any suitable inductive structure tapped at multiple locations. For example, in some embodiments, the tapping inductor 110 includes a single monolithic inductor formed over a substrate, such as a planar silicon inductor. In other embodiments, the tapping inductor 110 includes a metal coil having a number of turns and different tapping nodes or points for tapping signals. The tapping inductor 110 has any suitable shape, such as a circular spiral, octagonal spiral, or rectangular spiral. The tapping inductor 110 includes a symmetrical pair of tapping nodes per oscillator core. In this example, a first pair of symmetrical tapping nodes is coupled to two cores. The first pair of symmetrical tapping nodes includes a first tapping node 135 and a second tapping node 137.

The oscillator 100 includes a point of symmetry 115 at the center of the tapping inductor 110. The point of symmetry 115 is the midpoint of the tapping inductor 110.

The tapping inductor 110 and the capacitor 120 form a resonator tank (also referred as an LC circuit or a tank circuit), which controls the frequency of oscillation for the oscillator 100. The center frequency of the oscillator 100 is determined by the sizes of the inductor 110 and the capacitor 120 and the inductor's tapping points. The resonator tank is coupled between the symmetrical pairs of tapping nodes 135 and 137.

The core 130 of the oscillator 100 is symmetrically arranged about the point of symmetry 115 of the tapping inductor 110. The oscillator 100 includes one core 130. However, other embodiments can include more oscillator cores.

The oscillator core 130 is connected, using low-resistive traces, to the tapping inductor 110. The oscillator core 130 includes two cross-coupled pairs of transistors. In the oscillator core 130, a first pair of cross-coupled transistors includes a first transistor 132 and a second transistor 134, and a second pair of cross-coupled transistors includes a third transistor 136 and a fourth transistor 138. Sources of the transistors 132-134 are coupled to the biasing resistor 150, and a gate of each transistor 132-134 is coupled to a drain of the other transistor 132-134. Sources of the transistors 136-138 are coupled to the biasing resistor 152, and a gate of each transistor 136-138 is coupled to a drain of the other transistor 136-138. The drains of the transistors 132 and 136 are coupled together through the first tapping node 135, and the drains of the transistors 134 and 138 are coupled together through the second tapping node 137.

Note that although the oscillator core 130 shown in FIG. 1A includes two pairs of cross-coupled transistors, the oscillator 100 can include other oscillator cores having only one pair of cross-coupled transistors. The single pair of cross-coupled transistors could be located above or below the inductor 110 shown in FIGS. 1B and 1C, respectively.

In some embodiments, the transistors 132-134 include p-type transistors, and the transistors 136-138 include n-type transistors. In particular embodiments, these transistors could represent p-type and n-type metal-oxide semiconductor field effect transistors (MOSFETs). However, any other suitable switching devices could be used in the oscillator 100.

Each biasing resistor 150, 152 is coupled to the sources of a pair of cross-coupled transistors in one of the oscillator cores 130. Each biasing resistor 150, 152 includes any suitable resistive structure having any suitable resistance, such as a standard resistor or variable resistor rheostat. In certain embodiments, the biasing resistor can be a digitally programmable variable resistor (e.g. a MOS transistor), or other circuit element that limits current flow and determines an amplitude of the oscillator core 130.

The high-frequency performance of the oscillator 100 depends on how the inductor 110 and capacitor 120 are connected within the oscillator 100. The center frequency of the oscillator 100 is determined based on which oscillator cores are turned ON and which oscillator cores are turned OFF.

In certain embodiments, the source terminals of the pair of cross-coupled transistors 132, 134 (also for example, pair 136, 138) are coupled to a tail capacitor 160, 162. When a cross-coupled pair of n-type transistors is coupled to a cross-coupled pair of p-type transistors, as shown in the LPWTR oscillator 100, the common mode signal at the tail include ripple and signal rectification at the even harmonics of the oscillation frequencies. The tail capacitors 160 and 162 absorb signal at these harmonics to reduce ripple at the tail and improve the jitter performance of the oscillator. The tail capacitors 160,162 provide a harmonic filter functionality to the oscillator 100, such as filtering a second harmonic of the center frequency.

In some embodiments, the biasing resistors 150,152 are coupled to switches 170, 172, respectively, which turn the core ON and OFF. In this example, the first switch 170 turns the transistors 132-134 of the core 130 ON and OFF, and the second switch 172 turns the transistors 136-138 of the core 130 ON and OFF. The oscillator 100 can be controlled by voltage regulator 180 (for example, a low-dropout regulator (LDO)). The voltage regulator 180 can turn the first switch 170 and the second switch 172 ON and OFF together. The voltage regulator 180 regulates the supply voltage to an on-chip processing block. The voltage regulator 180 receives a variable voltage input (e.g., from a battery source) and outputs a fixed voltage to the on-chip signal processing block of the integrated circuit processor. That is, the voltage regulator 180 is digitally controlled by the on-chip signal processing block of the integrated circuit processor.

In other embodiments, both biasing resistors 150-152 are coupled to one switch (such as switch 170 or 172) that turns both pairs of cross-coupled transistors 132-138 ON and OFF. In this example of FIG. 1A, one switch turns the core 130 ON and OFF.

As shown in FIG. 1A, the control of the resistance between a voltage supply and the source terminals of a pair of cross-coupled transistors is sufficient to turn an oscillator core ON or OFF. For example, the switch 170 is coupled to the supply voltage close to the highest potential of the system, and the switch 172 is coupled to the ground potential close to the lowest potential of the system. For each biasing resistor 150, 152, the combined resistance of its serially-connected switch 170, 172 and its own resistance determines whether the associated oscillator core is ON or OFF. As a non-limiting example, a 1.5V supply can be applied to the switch 170, and the biasing resistor 150 could represent a 1 kΩ resistor. When the switch 170 is ON, the resistor 150 carries around 1 mA of current because the switch 170 contributes a negligible amount of resistance to the combination of switch 170 and resistor 150. When the switch 170 is OFF, the resistor 150 may carry around 0.1 mA (or smaller) current because the switch 150 contributes a much higher resistance to the combination of switch 170 and resistor 150. In this example, a 0.1 mA current is too low to turn ON the transistors 132-134 of the core 130. This example can be applied to any of the cores' biasing resistors and their respective serially-connected switches.

Each core 130 of the oscillator 100 provides reduced or minimal loading onto the resonator tank because each core 130 can be turned ON or OFF using its respective transistors 132-138. This scheme can be extended to any frequency of interest, including higher-frequency applications where the tuning range of an oscillator is very difficult to obtain.

In some embodiments, the oscillator 100 includes an oscillation condition (also used as a startup condition) in which an oscillation is sustained as long as an amount of current generated from passive circuit components dominates the losses consumed the active circuit components. When the oscillation condition is satisfied, thermal noise or intrinsic surrounding noise causes perturbations, and the oscillator 100 amplifies the noise signal using positive feedback, causing the noise signal to increase progressively (such as by using exponential characteristics with respect to time) until a steady state is reached. The amplification gain is large when the signal swing is very small, and the gain reduces to reach a steady state as the signal swing becomes large.

Figure 1B:
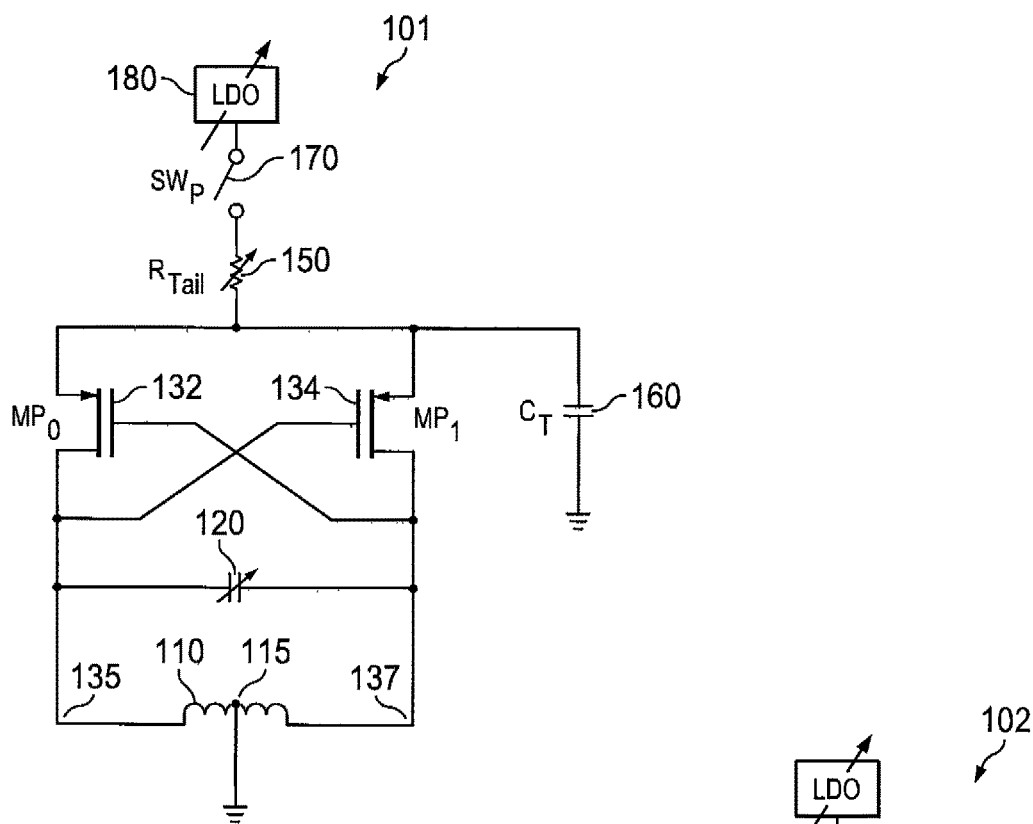

FIG. 1B shows an example low power wide tuning range LPWTR oscillator 101 according to this disclosure. The LPWTR oscillator 101 is similarly arranged as the LPWTR oscillator 100 and includes some of the same circuit elements as the LPWTR oscillator 100. The cross-coupled core of the LPWTR oscillator 101 is disposed above the tapping inductor 110. In FIG. 1B, the point of symmetry 115 of the inductor 110 is coupled to ground to provide bias to the core, and in comparison to FIG. 1A the point of symmetry 115 of the inductor 110 is self-biasing and not directly coupled to a voltage supply or ground.

Figure 1C:
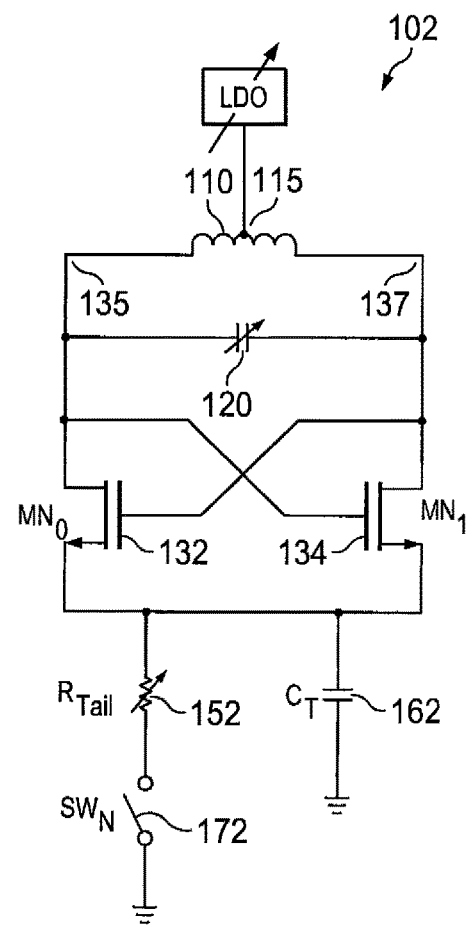

FIG. 1C shows an example low power wide tuning range LPWTR oscillator 102 according to this disclosure. The LPWTR oscillator 102 is similarly arranged as the LPWTR oscillator 100 and includes some of the same circuit elements as the LPWTR oscillator 100. The cross-coupled core of the LPWTR oscillator 102 is disposed below the tapping inductor 110. In FIG. 1C, the point of symmetry 115 of the inductor 110 is coupled to a voltage supply (for example, via the voltage regulator 180) to provide bias to the core, and in comparison to FIG. 1A the point of symmetry 115 of the inductor 110 is self-biasing and not directly coupled to a voltage supply or ground.

Figure 2A:
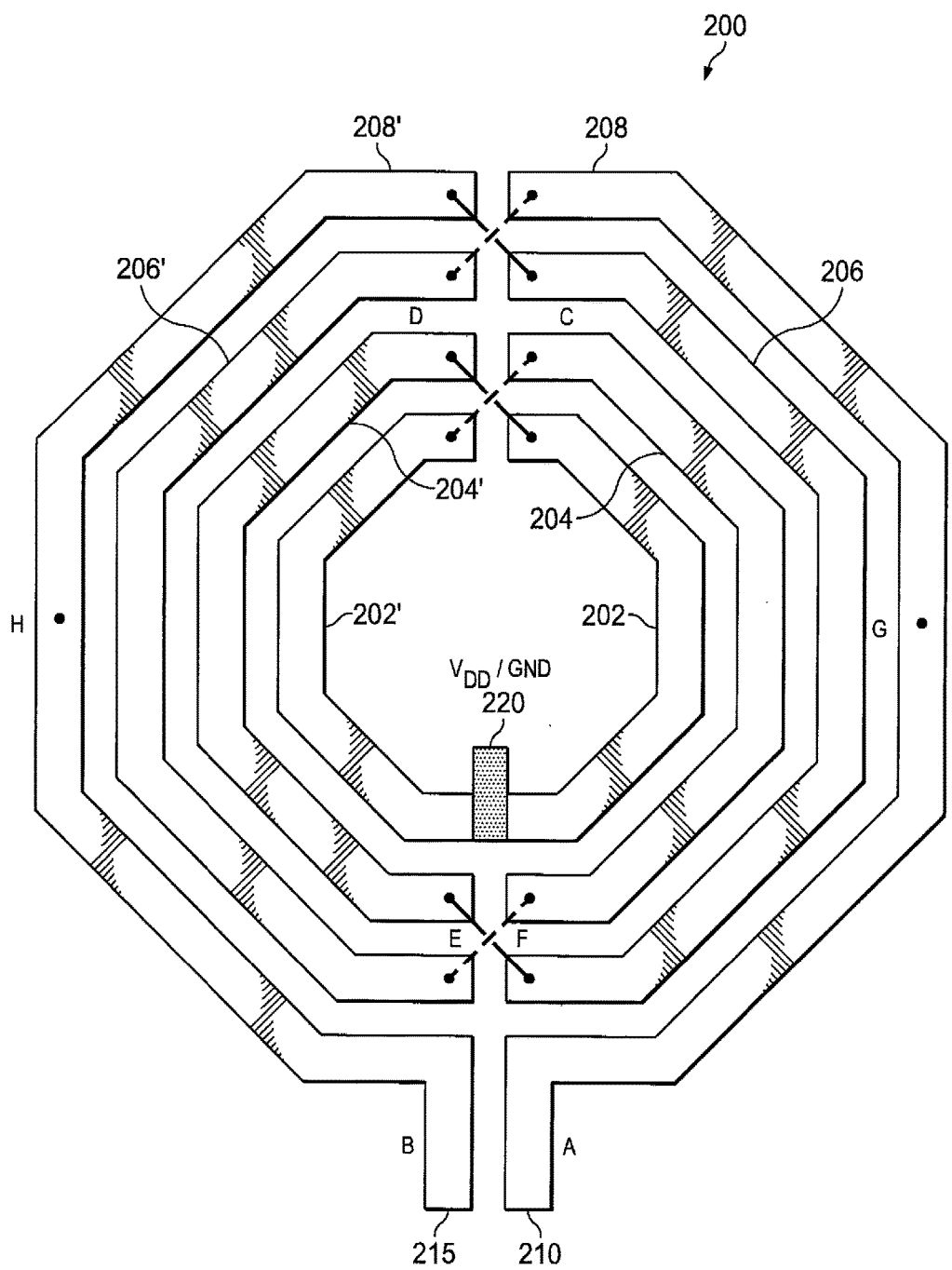
FIGS. 2A and 2B illustrate examples of tapping inductors fabricated on a substrate for an oscillator according to this disclosure.
Figure 2B:
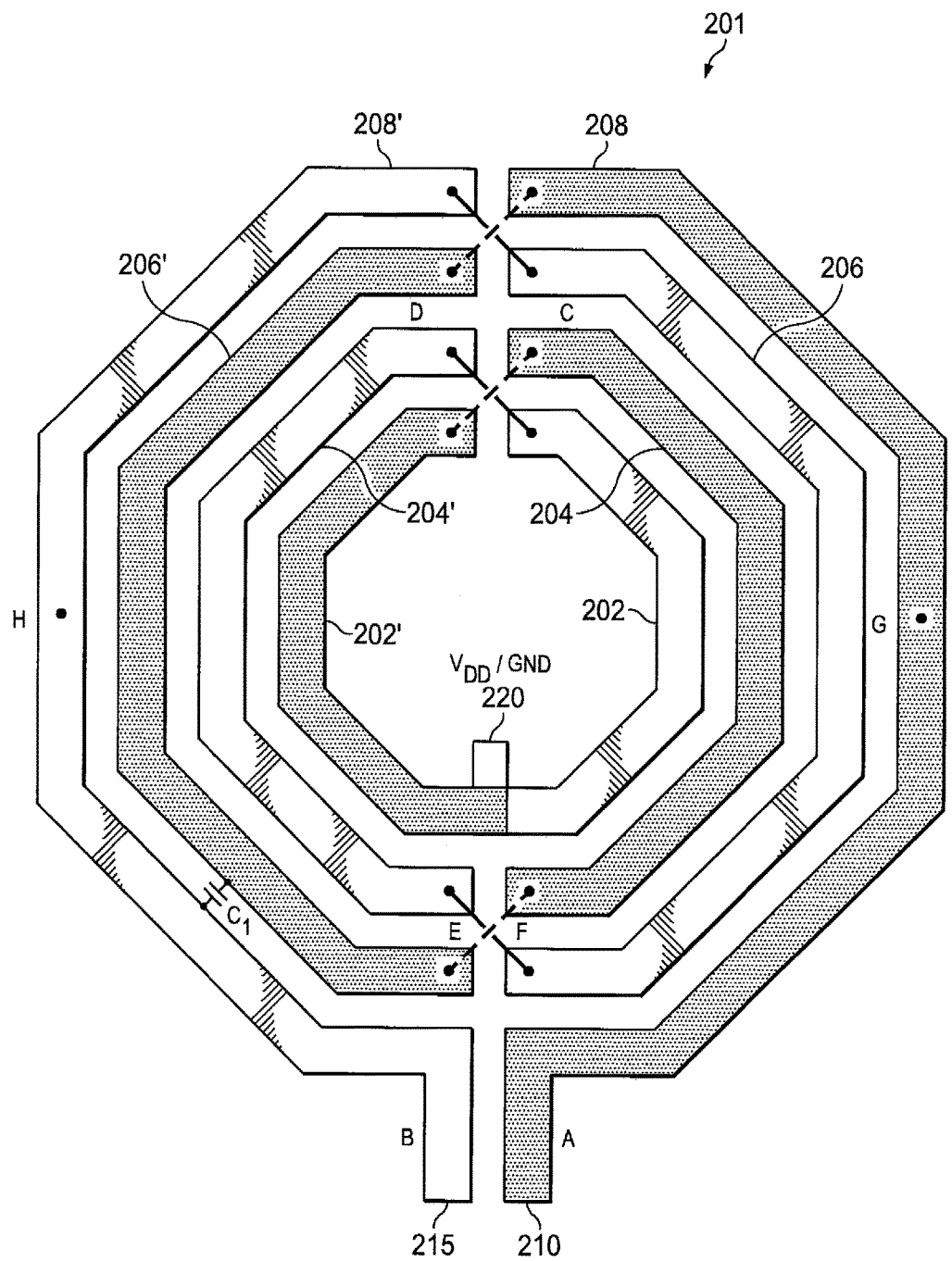

FIGS. 2A and 2B illustrate examples of tapping inductors 200-201 fabricated on a substrate for an oscillator according to this disclosure. Although certain details will be provided with reference to the components of the tapping inductors 200-201, it should be understood that other embodiments may include more, less, or different components. Either of the tapping inductors 200-201 could be used with the oscillator 100 of FIG. 1, although other tapping inductors could also be used in the oscillator 100.

Each tapping inductor 200-201 can be fabricated on any suitable substrate, such as silicon. In this example, each tapping inductor 200-201 includes electrically-conductive material (such as a conductive metal) formed into concentric ring segments 202/202', 204/204', 206/206', and 208/208'. These concentric ring segments are connected to form two coils having interleaved segments. Note, however, that the tapping inductors 200-201 can include segments forming more or less than four concentric rings.

In FIG. 2A, the concentric ring segments 202/202', 204/204', 206/206', and 208/208' are composed from the same material(s). In FIG. 2B, different concentric ring segments 202/202', 204/204', 206/206', and 208/208' are composed of different materials, such as different conductive materials. The outermost ring segments 208/208' have terminal ends 210-215, respectively. These terminal ends 210-215 can be coupled to other components of a circuit.

In some embodiments, the concentric rings are divided into segments bifurcated by a longitudinal axis of symmetry, thereby establishing eight half-rings. Accordingly, all points on the left-half of the tapping inductor 200-201 are reflected symmetrically as a mirror image on the right-half of the tapping inductor 200-201 to establish symmetrical pairs of tapping nodes.

Each tapping inductor 200-201 includes a point of symmetry 220 and multiple symmetrical pairs of tapping nodes (shown as {A,B} and {C,D}). The point of symmetry 220 (shown as VDD/GND) is the voltage supply point or grounding point of the tapping inductor 200-201. In embodiments where an oscillator core includes n-type transistors, the oscillator 100 becomes operational when the voltage supply VDD is connected to the point of symmetry 220. In embodiments where the oscillator core includes p-type transistors, the oscillator 100 becomes operational when the ground potential GND is connected to the point of symmetry 220.

In embodiments where the oscillator core includes a pair of cross-coupled p-type transistors and a pair of cross-coupled n-type transistors, the oscillator 100 becomes operational without connecting the voltage supply VDD or the ground potential GND to the point of symmetry 220. The differential symmetry and the self-biasing at the point of symmetry 220 within the tapping inductor 200-201 allows the oscillator 100 to operate without actually connecting to VDD or GND. The operating voltage of the oscillator 100 is automatically set by the DC operating condition at the point of symmetry 220. If two sinusoidal signals, oppositely phased with respect to each other, are applied to the terminals 210-215 of the oscillator 100, the effective AC swing at the point of symmetry 220 is substantially zero throughout time. Here, the length of conductor between the point of symmetry 220 and the terminal 210 can be substantially equal to the length of conductor between the point of symmetry 220 and the terminal 215.

To establish positive and negative terminals for each oscillator core 130, each oscillator core couples to two points of the tapping inductor 200-201, and those two points are symmetrical about the point of symmetry 220. For example, an oscillator core could couple to points {A,B} or {C,D} of the tapping inductor 200-201. If the oscillator 100 includes three cores, the third core can connect to another symmetrical pair of tapping nodes, such as {E,F} or {G,H}.

In the tapping inductor 200-201, the same number of turns and the same amount of inductance can be present between the point of symmetry 220 and each of the tapping nodes in a symmetrical pair. For example, the tapping node A and the tapping node B form a symmetrical pair. The amount of inductance between tapping node A and the point of symmetry 220 can be substantially equal to the amount of inductance between tapping node B and the point of symmetry 220. Similarly, the tapping node C and the tapping node D form a symmetrical pair. The amount of inductance between tapping node C and the point of symmetry 220 can be substantially equal to the amount of inductance between tapping node D and the point of symmetry 220.

Note that while the tapping nodes A-D in FIGS. 2A and 2B are shown at the ends of half-rings, each tapping inductor 200-201 can include tapping nodes at symmetrical points that are not disposed at ends where an axis of symmetry bifurcates concentric rings. For example, tapping nodes G and H are not located at ends of the concentric ring segments.

In particular embodiments, the tapping nodes A and B correspond to tapping nodes 137 and 135 of FIG. 1A, respectively. In particular embodiments, the tapping nodes C and D correspond to tapping nodes 135 and 137 of FIG. 1B, respectively. In particular embodiments, the tapping nodes E and F correspond to tapping nodes 137 and 135 of FIG. 1C, respectively. In particular embodiments, the tapping nodes A, B, C, D, E, F, G, and H correspond to tapping nodes 360, 365, 345, 340, 330, 335, 350, and 355 of FIG. 3. The tapping node E could represent a tapping node between the point of symmetry 115 and the tapping node 137, and the tapping node F could represent a tapping node between the point of symmetry 115 and the tapping node 135. Also, the tapping node G could represent a tapping node between tapping nodes 137 and 147, and the tapping node H could represent a tapping node between tapping nodes 135 and 145.

By selecting a first tapping point on the tapping inductor 200-201 at which to couple an oscillator core, the location of a symmetrical tapping point to pair with the selected first tapping point is determined as a mirror image reflection point across the longitudinal axis of symmetry. The various tapping nodes enable the physically single monolithic tapping inductor 200-201 to function schematically as multiple separate inductors. The silicon area of a single monolithic tapping inductor is equal to or less than the silicon area of multiple separate inductors.

A transformer generally includes primary and secondary terminals separated from each other, where a magnetic core couples energy from the primary terminal to the secondary terminal (or vice versa). A coupling factor describes the electrical loss of energy within the magnetic core. By comparison, the tapping inductor 200-201 does not provide direct current (DC) isolation between two poles. In the tapping inductor 200-201, tapping different points on a single coil causes no loss of electrical signal since there are no magnetic core coupling losses and no loss of electrical signal due to multiple (primary and secondary) coils.

Figure 3:
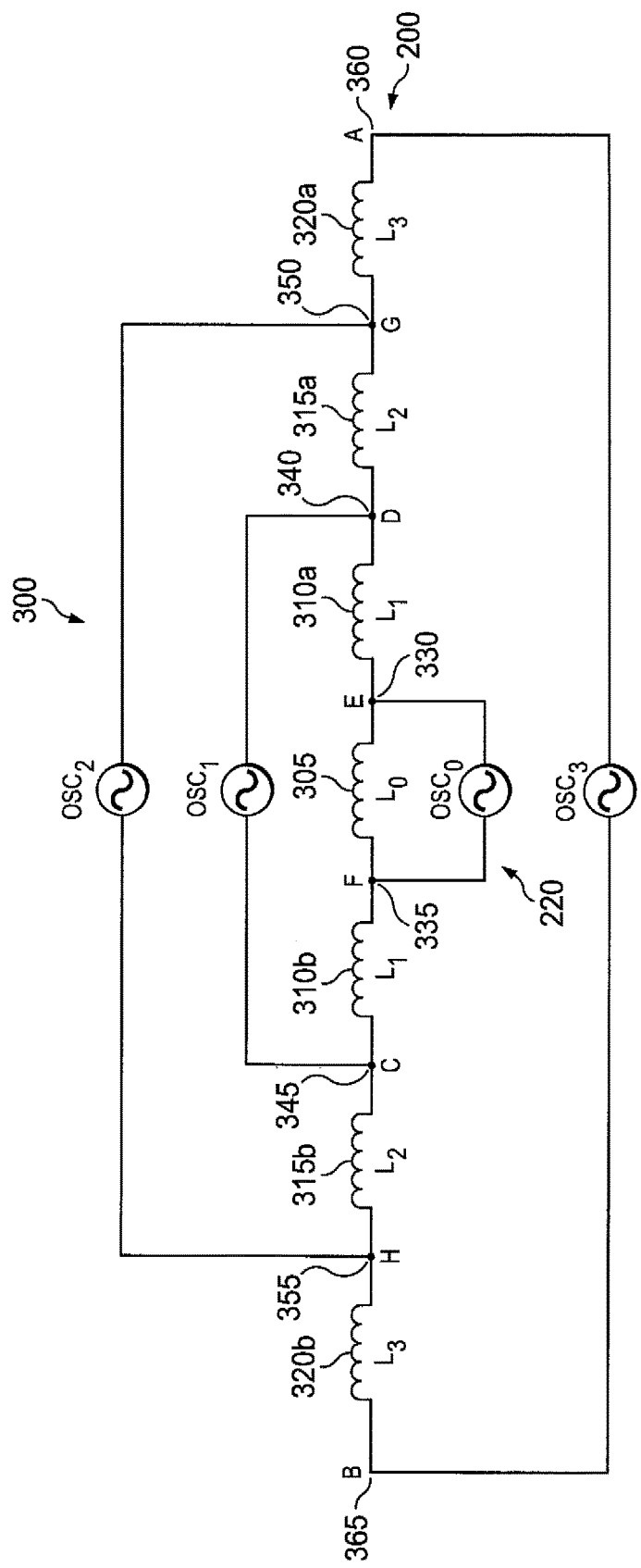
FIG. 3 illustrates multiple oscillator cores symmetrically coupled to a tapping inductor having multiple tapping nodes according to this disclosure.

FIG. 3 illustrates multiple oscillator cores symmetrically coupled to a tapping inductor having multiple symmetrical tapping nodes according to this disclosure. Although certain details will be provided with reference to the components of the multiple oscillator cores and tapping inductor, it should be understood that other embodiments may include more, less, or different components.

In FIG. 3, the oscillator 300 includes four oscillator cores, namely an inner core OSC0, an outer core OSC3, and intermediate cores including an antepenultimate core OSC1, a penultimate core OSC2. However, other embodiments can include more or fewer oscillator cores.

The tapping inductor 200 is schematically represented as seven inductors 305 (L0), 310*a-b* (L1), 315*a-b* (L2), 320*a-b* (L3). The point of symmetry 220 of the tapping conductor 200 is the midpoint of the tapping inductor 200. More particularly, the point of symmetry 220 is the midpoint of the inductor 305 (L0). The tapping inductor 200 includes a plurality of pairs of tapping nodes, and each pair is centered about the point of symmetry 220. The inductor 310*a* may have substantially the same amount of inductance as the inductor 310*b*, and the inductor 315*a* may have substantially the same amount of inductance as the inductor 315*b*. The inductors 320*a-b* have a substantially same amount of impedance as each other. In some embodiments, a conductor in the inductor 310*a* has substantially the same length as a conductor in the inductor 310*b*, and a conductor in the inductor 315*a* has substantially the same length as a conductor in the inductor 315*b*. The inductors 320*a-b* have a substantially same amount of impedance as each other. That is, each L1 inductor 310*a-b* has the same impedance; each L2 inductor 315*a-b* has the same impedance; each L3 inductor 320*a-b* has the same impedance; and each half of the L0 inductor 305 has the same impedance.

In this example, a four pairs of symmetrical tapping nodes are respectively coupled to four oscillator cores. Each oscillator core includes a resonator tank having a different amount of inductance based on the location of the corresponding tapping nodes. The first pair of symmetrical tapping nodes includes a first tapping node 330 and a second tapping node 335, which are coupled to the inner oscillator core OSC0. The resonator tank of the oscillator core OSC0 has an inductance amount of L0. The second pair of symmetrical tapping nodes includes a third tapping node 340 and a fourth tapping node 345, which are coupled to the inter-mediate, antepenultimate oscillator core OSC1. The resonator tank of the oscillator core OSC1 has an inductance amount of $L0+2\times L1$. The third pair of symmetrical tapping nodes includes a fourth tapping node 350 and a fifth tapping node 355, which are coupled to the intermediate, penultimate oscillator core OSC2. The resonator tank of the oscillator core OSC2 has an inductance amount of $L0+2\times L1+2\times L2$. The fourth pair of symmetrical tapping nodes includes a sixth tapping node 360 and a seventh tapping node 365, which are coupled to the outer oscillator core OSC3. The resonator tank of the oscillator core OSC3 has an inductance amount of L0+2×L1+2×L2+2×L3.

The center frequency of the oscillator 300 is determined based on which oscillator cores are turned ON and which oscillator cores are turned OFF. For example, the center frequency of the oscillator 300 when the inner core OSC0 is ON and the outer core OSC3 is OFF is different from the center frequency of the oscillator 300 when both cores OSC0 and OSC3 are ON, which is also different from the center frequency of the oscillator 300 when the inner core OSC0 is OFF and the outer core OSC3 is ON.

Although FIGS. 1A-1C and 3 illustrate examples of a low power wide tuning range oscillator 100-102 and 300, various changes may be made to FIGS. 1A-1C and 3. For example, the functional division shown in FIGS. 1A-1C and 3 is for illustration only. Various components in FIGS. 1A-1C and 3 could be combined, further subdivided, or omitted and additional components could be added according to particular needs. Although FIGS. 2A and 2B illustrate examples of tapping inductors fabricated on a substrate for an oscillator, various changes may be made to FIGS. 2A and 2B. For instance, each segment in a tapping inductor could have any suitable size, shape, and dimensions.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed:

1. An oscillator comprising:
a first oscillator core comprising:
a first pair of cross-coupled transistors including first and second transistors; and
a first variable resistor coupled to the first pair of cross-coupled transistors; and
a resonator tank comprising a capacitor and a tapping inductor, the tapping inductor having a first symmetrical pair of tapping nodes including first and second tapping nodes, the first tapping node coupled to the first transistor, the second tapping node coupled to the second transistor, the capacitor coupled between the first and second tapping nodes;
wherein the tapping inductor has differential symmetry and self biasing at a point of symmetry within the tapping inductor;
wherein when a first signal and a second signal, the first and second signal being opposite in phase, are applied to terminals of the oscillator, an effective AC swing at the point of symmetry is substantially zero.

2. The oscillator of claim 1, wherein:
the first oscillator core further comprises:
a second pair of cross-coupled transistors including third and fourth transistors; and
a second variable resistor coupled to the second pair of cross-coupled transistors;
the first tapping node is coupled to the third transistor; and
the second tapping node is coupled to the fourth transistor.

3. The oscillator of claim 2, wherein:
the first pair of cross-coupled transistors comprises p-type transistors; and
the second pair of cross-coupled transistors comprises n-type transistors.

4. The oscillator of claim 1, wherein:
the oscillator further comprises a second oscillator core comprising:
a second pair of cross-coupled transistors including third and fourth transistors; and
a second variable resistor coupled to the second pair of cross-coupled transistors; and
the tapping inductor has a second symmetrical pair of tapping nodes including third and fourth tapping nodes, the third tapping node coupled to the third transistor, the fourth tapping node coupled to the fourth transistor.

5. The oscillator of claim 4, wherein the oscillator further comprises:
a first switch coupled to the first variable resistor; and
a second switch coupled to the variable second resistor.

6. The oscillator of claim 4, wherein:
the first oscillator core further comprises:
a third pair of cross-coupled transistors including fifth and sixth transistors; and
a third variable resistor coupled to the third pair of cross-coupled transistors;
the second oscillator core further comprises:
a fourth pair of cross-coupled transistors including seventh and eighth transistors; and
a fourth variable resistor coupled to the fourth pair of cross-coupled transistors;
the first tapping node is coupled to the fifth transistor;
the second tapping node is coupled to the sixth transistor;
the third tapping node is coupled to the seventh transistor; and
the fourth tapping node is coupled to the eighth transistor.

7. The oscillator of claim 1, wherein the tapping inductor comprises a monolithic inductor.

8. The oscillator of claim 7, wherein the tapping inductor comprises concentric ring segments electrically connected to form first and second coils, the concentric ring segments of the first coil interleaved with the concentric ring segments of the second coil.

9. An oscillator comprising:
a first oscillator core comprising:
a first pair of cross-coupled transistors including first and second transistors, the first transistor having a first source, a first gate, and a first drain, the second transistor having a second source, a second gate, and a second drain, wherein the first gate is coupled to the second drain and the second gate is coupled to the first drain; and
a first variable resistor coupled to the first and second sources; and a resonator tank comprising a capacitor and a tapping inductor, the tapping inductor having a first symmetrical pair of tapping nodes including first and second tapping nodes, the first tapping node coupled to the first drain, the second tapping node coupled to the second drain, the capacitor coupled between the first and second tapping nodes;

wherein the tapping inductor has differential symmetry and self biasing at a point of symmetry within the tapping inductor;

wherein when a first signal and a second signal, the first and second signal being opposite in phase, are applied to terminals of the oscillator, an effective AC swing at the point of symmetry is substantially zero.

10. The oscillator of claim 9, wherein:
the first oscillator core further comprises:
   a second pair of cross-coupled transistors including third and fourth transistors, the third transistor having a third source, a third gate, and a third drain, the fourth transistor having a fourth source, a fourth gate, and a fourth drain, wherein the third gate is coupled to the fourth drain and the fourth gate is coupled to the third drain; and
   a second variable resistor coupled to the third and fourth sources;
the first tapping node is coupled to the third drain; and
the second tapping node is coupled to the fourth drain.

11. The oscillator of claim 9, wherein:
the oscillator further comprises a second oscillator core comprising:
   a second pair of cross-coupled transistors including third and fourth transistors, the third transistor having a third source, a third gate, and a third drain, the fourth transistor having a fourth source, a fourth gate, and a fourth drain, wherein the third gate is coupled to the fourth drain and the fourth gate is coupled to the third drain; and
   a second variable resistor coupled to the third and fourth sources; and
the tapping inductor has a second symmetrical pair of tapping nodes including third and fourth tapping nodes, the third tapping node coupled to the third drain, the fourth tapping node coupled to the fourth drain.

12. The oscillator of claim 11, wherein the oscillator further comprises:
a first switch coupled to the first variable resistor; and
a second switch coupled to the second variable resistor.

13. The oscillator of claim 11, wherein:
the first oscillator core further comprises:
   a third pair of cross-coupled transistors including fifth and sixth transistors, the fifth transistor having a fifth source, a fifth gate, and a fifth drain, the sixth transistor having a sixth source, a sixth gate, and a sixth drain, wherein the fifth gate is coupled to the sixth drain and the sixth gate is coupled to the fifth drain; and
   a third variable resistor coupled to the fifth and sixth sources;
the second oscillator core further comprises:
   a fourth pair of cross-coupled transistors including seventh and eighth transistors, the seventh transistor having a seventh source, a seventh gate, and a seventh drain, the eighth transistor having an eighth source, an eighth gate, and an eighth drain, wherein the seventh gate is coupled to the eighth drain and the eighth gate is coupled to the seventh drain; and
   a fourth variable resistor coupled to the seventh and eighth sources;
the first tapping node is coupled to the fifth drain;
the second tapping node is coupled to the sixth drain;
the third tapping node is coupled to the seventh drain; and
the fourth tapping node is coupled to the eighth drain.

14. The oscillator of claim 9, wherein the tapping inductor comprises a monolithic inductor.

15. The oscillator of claim 14, wherein the tapping inductor comprises concentric ring segments electrically connected to form first and second coils, the concentric ring segments of the first coil interleaved with the concentric ring segments of the second coil.

* * * * *